(12) United States Patent
Wang et al.

(10) Patent No.: US 8,003,216 B2
(45) Date of Patent: Aug. 23, 2011

(54) HEAT-CONDUCTIVE DIELECTRIC POLYMER MATERIAL AND HEAT DISSIPATION SUBSTRATE CONTAINING THE SAME

(75) Inventors: David Shau Chew Wang, Taipei (TW); En Tien Yang, Taipei (TW); Jyh Ming Yu, Kaohsiung (TW); Fu Hua Chu, Taipei (TW)

(73) Assignee: Polytronics Technology Corporation (TW)

( * ) Notice: Subject to any disclaimer, the term of this patent is extended or adjusted under 35 U.S.C. 154(b) by 855 days.

(21) Appl. No.: 11/699,710

(22) Filed: Jan. 30, 2007

(65) Prior Publication Data

US 2008/0073623 A1 Mar. 27, 2008

(30) Foreign Application Priority Data

Sep. 26, 2006 (TW) ................................ 95135494 A

(51) Int. Cl.
*B32B 15/092* (2006.01)
*B32B 27/20* (2006.01)
*B32B 27/38* (2006.01)
*C08K 3/14* (2006.01)
*C08K 3/20* (2006.01)
*C08K 3/22* (2006.01)
*C08K 3/28* (2006.01)
*C08K 3/34* (2006.01)
*C08K 3/38* (2006.01)
*C08L 63/00* (2006.01)

(52) U.S. Cl. ........ 428/416; 428/414; 428/418; 523/445; 523/457; 523/458; 525/523; 525/524; 525/525; 525/526; 525/533

(58) Field of Classification Search .................... None
See application file for complete search history.

(56) References Cited

U.S. PATENT DOCUMENTS

| | | | | |
|---|---|---|---|---|
| 5,482,784 A * | 1/1996 | Ohara et al. | ................. | 428/607 |
| 5,965,269 A | 10/1999 | Inada et al. | | |
| 6,140,402 A * | 10/2000 | Dietz et al. | .................... | 524/403 |
| 6,197,898 B1 * | 3/2001 | van den Berg et al. | ....... | 525/523 |
| 6,265,471 B1 * | 7/2001 | Dietz | ............................ | 523/458 |
| 6,391,408 B1 * | 5/2002 | Hutchinson | ................. | 428/35.7 |
| 2005/0277351 A1 * | 12/2005 | Smith et al. | ................... | 442/110 |

FOREIGN PATENT DOCUMENTS

| | | |
|---|---|---|
| JP | 08-332696 A | 12/1996 |
| JP | 10-242606 A | 9/1998 |
| JP | 2001-106811 A * | 4/2001 |
| JP | 2004-292594 A | 10/2004 |
| TW | 425423 | 3/2001 |
| TW | 452897 | 9/2001 |
| TW | I224123 | 11/2004 |
| WO | WO 92/08073 A1 | 5/1992 |

OTHER PUBLICATIONS

Definition of "interpenetrating polymer network (IPN)"; IUPAC Compendium of Chemical Terminology, 2nd Editiion (1997).*
Machine translation of JP 2001-106811 A, provided by the JPO website (no date).*
English Abstract of TW I224123 dated Nov. 21, 2004.
English Abstract of TW 452897 dated Sep. 1, 2001.
Third Party Submission filed with Japan Patent Office and English translation.

* cited by examiner

*Primary Examiner* — Michael J Feely
(74) *Attorney, Agent, or Firm* — Seyfarth Shaw LLP

(57) ABSTRACT

A heat-conductive dielectric polymer material having an inter-penetrating-network (IPN) structure includes a polymer component, a curing agent, and a heat-conductive filler uniformly dispersed in the polymer component. The polymer component includes a thermoplastic plastic and a thermosetting epoxy resin. The curing agent is used to cure the thermosetting epoxy resin at a curing temperature. The heat conductivity of the heat-conductive dielectric polymer material is larger than 0.5 W/mK. A heat dissipation substrate including the heat-conductive dielectric polymer material in the present invention has a thickness of less than 0.5 mm and bears a voltage of over 1000 volts.

19 Claims, 1 Drawing Sheet

HEAT-CONDUCTIVE DIELECTRIC POLYMER MATERIAL AND HEAT DISSIPATION SUBSTRATE CONTAINING THE SAME

FIELD OF THE INVENTION

The present invention relates to a heat-conductive dielectric polymer material and a heat dissipation substrate including the heat-conductive dielectric polymer material, and more particularly to a heat-conductive dielectric polymer material having an inter-penetrating-network (IPN) structure and a heat dissipation substrate including the heat-conductive dielectric polymer material.

DESCRIPTION OF THE PRIOR ART

Recently, the light emitting diode (LED) has gained considerable attention worldwide as an important new technology with broad applications and numerous benefits. LED technology offers the advantages of having a small volume, low power consumption, long lifetime, a favorable reaction speed, and overcomes many of the problems of incandescent lamps. LED technology is used in many applications, including backlights for the LCD displays, mini-projectors, illuminators and light sources for vehicles, attracting increasing attention.

However, in high-power LEDs used for illumination, only about 15%-20% of the power inputted into the LED is converted into light, while the remaining 80%-85% is converted into heat, and the heat cannot be dissipated to the environment at the appropriate time. Thus, the interfacial temperature of the LED component is excessively high, thereby affecting the intensity of the emitted lights and the lifetime. Therefore, heat management of LED components becomes increasingly important.

FIG. 1 is a schematic view of a heat dissipation substrate 10 conventionally applied in an electronic component (e.g., an LED component, not shown). The heat dissipation substrate 10 includes a dielectric heat-conductive material layer 12 and two metal foils 11 respectively stacked on the upper and lower surfaces of the dielectric heat-conductive material layer 12. The electronic component is disposed above the upper metal foil 11. The conventional process for forming the heat dissipation substrate 10 includes the following steps. First, a liquid epoxy resin and a heat-conductive filler (e.g., aluminum oxide particles) are mixed, and then a curing agent is added, so as to form a slurry. Gas contained in the slurry is then removed through a vacuum process and the slurry is coated on the lower metal foil 11. The upper metal foil 11 is then disposed on the surface of the slurry to form a composite structure of metal foil/slurry/metal foil. Next, the composite structure is hot pressed and cured to form the heat dissipation substrate 10, wherein the slurry is formed into the dielectric heat-conductive material layer 12 upon being hot pressed and cured.

However, the conventional art is limited by the property of the slurry and has the following disadvantages: (1) the conventional art must be finished within a specific time; otherwise, the slurry will cure and cannot be coated on the metal foil, causing a waste of the slurry; and (2) when the hot pressing step is conducted in the conventional art, a quantity of slurry flows out of the two metal foils 11, and a separation between solid and liquid occurs upon reaching the hot pressing temperature, thus, the electrically conductive filler is non-uniformly distributed in the dielectric heat-conductive material layer 12, thereby affecting the heat dissipation efficiency of the heat dissipation substrate 10. Furthermore, as for the slurry, it is difficult to store and the flexibility of the process for forming the heat dissipation substrate is limited by the viscosity of the slurry (e.g., heat dissipation substrates with different shapes cannot be fabricated efficiently).

SUMMARY OF THE INVENTION

An aspect of the present invention is to provide a heat-conductive dielectric polymer material, which has an inter-penetrating-network (IPN) structure and is rubbery, thereby enhancing its workability and heat dissipation property.

Another aspect of the present invention is to provide a heat dissipation substrate including the heat-conductive dielectric polymer material, which has a preferable heat dissipation property and a high voltage-resistant dielectric property.

The present invention discloses a heat-conductive dielectric polymer material having an IPN structure, which comprises a polymer component, a curing agent, and a heat-conductive filler. The polymer component comprises a thermoplastic plastic and a thermosetting epoxy resin. The curing agent is used to cure the thermosetting epoxy resin under a curing temperature. The heat-conductive filler is uniformly dispersed in the polymer component. The heat conductivity of the heat-conductive dielectric polymer material is larger than 0.5 W/mK. The thermoplastic plastic and the thermosetting epoxy resin are mutually soluble and they could form a compatible or homogeneous mixture; thus, the heat-conductive filler is uniformly dispersed in the IPN, thereby achieving the optimal heat-conductive efficiency. Calculated on the basis of volume percentage, the thermoplastic plastic comprises 10% to 75% of the polymer component, and due to the property of the thermoplastic plastic, the heat-conductive dielectric material is molded by means of a thermoplastic plastic process (such as extrusion, calendaring, or injection molding). Furthermore, the thermosetting plastic is also included, and is cured and cross linked under a high temperature, so as to form an IPN structure of the thermoplastic plastic and the thermosetting plastic, which not only has the thermosetting plastic properties of high temperature resistance and no deformation and the thermosetting plastic property of being strong but not fragile, but also can be strongly adhered to a metal electrode or substrate. Calculated on the basis of volume percentage, the heat conducting filler comprises 40% to 70% of the total volume of the heat-conductive dielectric polymer material. The present invention further discloses a heat dissipation substrate, which comprises a first metal layer, a second metal layer, and a heat-conductive dielectric polymer material layer. The heat-conductive dielectric polymer material layer is sandwiched between the first metal layer and the second metal layer, and forms a physical contact there-between, with a heat conductivity larger than 0.5 W/mK. The heat dissipation substrate has a thickness of less than 0.5 mm and bears a voltage of over 1000 volts.

BRIEF DESCRIPTION OF THE DRAWINGS

The invention will be described according to the appended drawings in which.

DETAILED DESCRIPTION OF THE INVENTION

The heat-conductive dielectric polymer material of the present invention includes a polymer component, a curing agent, and a heat-conductive filler having an IPN structure. The polymer component includes a thermoplastic plastic and a thermosetting epoxy resin; calculated on the basis of volume percentage, the thermoplastic plastic comprises 10% to 75% of the polymer component. The curing agent is used to cure the thermosetting epoxy resin under a curing temperature. The heat-conductive filler is uniformly dispersed in the polymer component; calculated on the basis of volume percentage, it comprises 40% to 70% of the heat-conductive dielectric polymer material. The heat conductivity of the heat-conductive dielectric polymer material is larger than 0.5 W/mK.

Figure 1:
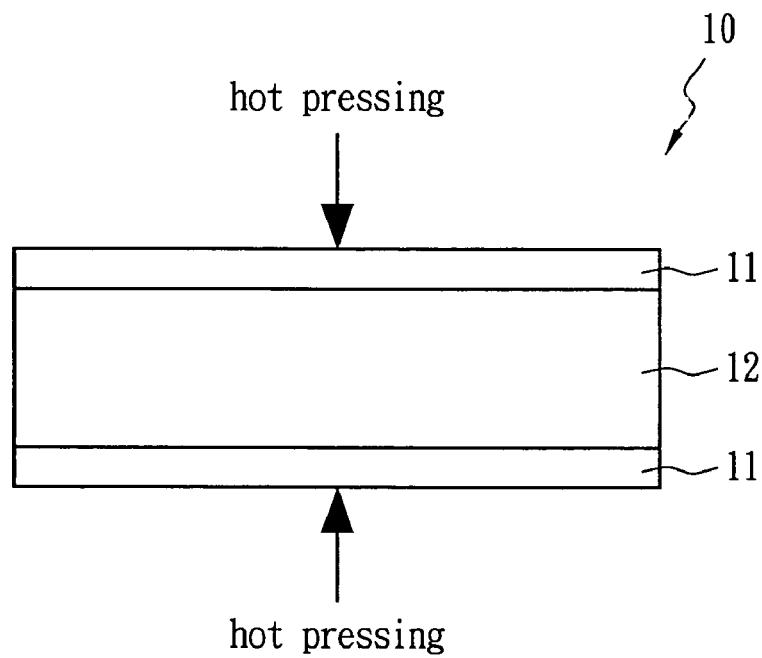
FIG. 1 is a schematic view of a heat dissipation substrate conventionally applied in an electronic component.
Figure 2:
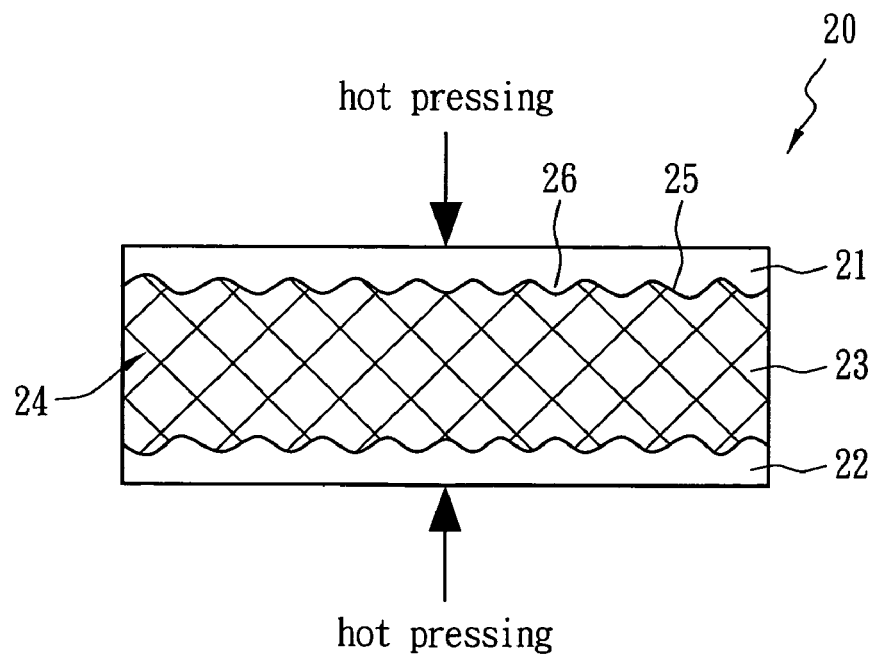
FIG. 2 is a schematic view of a heat dissipation substrate of the present invention.

FIG. 2 is a schematic view of a heat dissipation substrate 20 of the present invention. The heat dissipation substrate 20 includes a first metal layer 21, a second metal layer 22, and a heat-conductive dielectric polymer material layer 23 with an IPN structure 24. The heat-conductive dielectric polymer material layer 23 is in physical contact with the first metal layer 21 and the second metal layer 22, and at least one of the interfaces is a micro rough surface 25 that includes a plurality of nodular protrusions 26 with the diameters mainly distributed between 0.1 μm and 100 μm, so as to enhance the tensile strength there-between.

The methods for fabricating the heat-conductive dielectric polymer material layer 23 and the heat dissipation substrate 20 are described as follows. First, the thermoplastic plastic and the thermosetting epoxy resin are mixed while being heated at 200° C. for 30 minutes, so as to form a uniform mixture. The heat-conductive filler is then added into the uniform mixture, and they are mixed evenly to form a uniform rubbery material. The curing agent and an accelerating agent are then added into the uniform rubbery material at a temperature of 80° C., wherein the uniform rubbery material has an IPN structure 24. A hot pressing process is then used to dispose the uniform rubbery material between two release films at 100° C., which is then leveled under a pressure of 30 kg/cm², so as to form the heat-conductive dielectric polymer material layer 23, wherein the layer 23 is a lamella-shaped heat-conductive dielectric composite material. In order to fabricate the heat dissipation substrate 20, the two release films are stripped off from the upper and lower surfaces of the heat-conductive dielectric polymer material layer 23. An uncured free-standing lamella-shaped film (i.e., the heat-conductive dielectric polymer material layer 23) is thus prepared. Next, the heat-conductive dielectric polymer material layer 23 is sandwiched between the first metal layer 21 and the second metal layer 22, and after being hot pressed for 30 minutes at 160° C. (the thickness is controlled, for example, 0.2 mm), a heat dissipation substrate 20 with a thickness of 0.2 mm is formed. During the above hot pressing process, due to having the IPN structure 24, the lamella-shaped heat-conductive dielectric composite material will not be separated. The material of the first metal layer 21 and the second metal layer 22 is selected from copper, nickel, or another metal processed by means of electroplated or other physical coating methods. The appearance of the lamella-shaped heat-conductive dielectric composite material is rubbery (not slurry); thus, it is easily stored and processed. Moreover, the heat-conductive dielectric composite material also can be processed by a method commonly used for processing a thermoplastic plastic, thereby enhancing its workability.

Table 1 is a comparative example table of the heat-conductive dielectric polymer material layer used in the heat dissipation substrate of the four embodiments and the comparative example of the present invention in terms of the component, appearance, heat conductivity, and the corresponding voltage resistance of the heat dissipation substrate. The thickness of the heat dissipation substrate in each embodiment and comparative example is 0.2 mm.

TABLE 1

| | Component (volume %) | | | | Uncured Appearance | Whether being filler settlement (100° C.) | Whether being pressed into uncured free-standing lamella-shaped film | Heat Conductivity (W/mK) | Breakdown Voltage (KV) |
| --- | --- | --- | --- | --- | --- | --- | --- | --- | --- |
| | Heat-Conductive Filler Al₂O₃ | Liquid Epoxy Resin DER331 | Curing Agent 100S/ Accelarting Agent UR500 | Thermoplastic Plastic Phenoxy | | | | | |
| Embodiment 1 | 40 | 42 | 2.5/0.21 | 15 | rubbery | No | Yes | 0.51 | 8.2 |
| Embodiment 2 | 60 | 28 | 1.7/0.14 | 10 | rubbery | No | Yes | 1.45 | 7.8 |
| Embodiment 3 | 60 | 19 | 1.1/0.1 | 20 | rubbery | No | Yes | 1.52 | 7.5 |
| Embodiment 4 | 70 | 23.5 | 1.4/0.12 | 5 | rubbery | No | Yes | 2.43 | 6.9 |
| Comparative example | 60 | 38 | 2.3/0.19 | 0 | slurry | Yes | No | 1.48 | 7.4 |

The particle size of the Al₂O₃ particle (heat-conductive filler) in Table 1 is between 5 and 45 μm, which is produced by Denki Kagaku Kogyo Kabushiki Kaiya Company. The liquid epoxy resin adopts the DER331™ of Dow Chemical Company, which is a thermosetting epoxy resin. The curing agent adopts a dicyandiamide (Dyhard 100S™) of Degussa Fine Chemicals Company, and the accelerating agent is UR-500. The thermoplastic plastic is an ultra-high molecular phenoxy resin (PKHH™, obtained from the Phenoxy Associates) with a weight average Mw of larger than 30000.

It can be known from Table 1 that, in Embodiments 1-4 of the present invention, after the curing agent is added, the thermosetting epoxy resin (the liquid epoxy resin is used in the Embodiments and Comparative example in Table 1) is reacted with the thermoplastic plastic to form an IPN structure, thus, the obtained heat-conductive dielectric polymer material layer has a rubbery appearance and is suitable for a pressing process, and filler settlement will not occur during the hot pressing process at 100° C. Moreover, according to the heat conductivity and breakdown voltage shown in Table 1, the four embodiments of the present invention can indeed satisfy the requirements for the heat dissipation conditions of electronic components.

The thermoplastic plastic and the thermosetting epoxy resin in the heat-conductive dielectric polymer material of the present invention are substantially mutually soluble. The term "substantially mutually soluble" means that the thermoplastic plastic and the thermosetting epoxy resin are mixed to form a solution having a single glass transition temperature. The thermoplastic plastic and the thermosetting epoxy resin are mutually soluble; thus, when mixed together, the thermoplastic plastic is dissolved into the thermosetting epoxy resin, so that the glass transition temperature of the thermoplastic plastic is substantially reduced, and the mixing process is allowed to be conducted under a temperature lower than the normal softening temperature of the thermoplastic plastic. The formed mixture (i.e., the polymer component) is rubbery (or solid) at room temperature and thus is easily weighted and stored. For example, even if the thermosetting epoxy resin is a liquid epoxy resin, the mixture formed by mixing with the thermoplastic plastic is not liquid, but can be fabricated into a tough leathery film. At 25° C., the mixture has a relatively high viscous coefficient (about $10^5$ to $10^7$ poise), which is sufficient to prevent filler from settling or redistribution in the polymer matrix. Moreover, the mixture has a sufficiently soft rubbery nature at common mixing temperatures (about 40° C. to 100° C.) to allow the added curing agent and heat-conductive filler to be uniformly distributed in the mixture via roller mill mixing process. Many examples of the mixture can be obtained with reference to U.S. patent application Ser. No. 07/609,682 (filed on 6 Nov. 1990 and abandoned now) and PCT Patent Publication No. WO92/08073 (published on 14 May 1992), which are both incorporated herein by reference.

The curing temperature Tcure of the curing agent in the heat-conductive dielectric polymer material of the present invention is higher than 100° C., which is used to cure (i.e., cross link or catalytic-polymerize) the thermosetting epoxy resin. The curing agent is used to quickly cure the thermosetting epoxy resin under a temperature higher than the mixing temperature $T_{mix}$, wherein the mixing temperature $T_{mix}$ refers to the temperature at which the thermoplastic plastic, the thermosetting epoxy resin, and the curing agent are mixed together, and the mixing temperature $T_{mix}$ is usually about 25° C. to 100° C. When the curing agent is mixed at the mixing temperature $T_{mix}$, a substantial curing will not be induced. The adding amount of the curing agent in the present invention causes the thermosetting epoxy resin to be cured at a temperature higher than the mixing temperature $T_{mix}$. Preferably, the curing agent will not induce a substantial curing at a temperature of lower than about 100° C., and accordingly, the heat-conductive dielectric polymer material remains substantially uncured at 25° C. for at least half a year.

Besides the selected materials in Table 1, the thermoplastic plastic in the heat-conductive dielectric polymer material of the present invention is selected from the substantially amorphous thermoplastic resin, and its definition can be obtained with reference to Page 1 of "*Saechtling International Plastic Handbook for the Technology Engineer and User*, Second Edition, 1987, Hanser Publishers, Munich." The term "substantially amorphous" means that the proportion of the part of "crystallinity" in the resin is at most 15%, and preferably 10%, and especially preferably 5%, for example, a crystallinity of 0% to 5%. The substantially amorphous thermoplastic resin is a high-molecular polymer, which is rigid or rubbery at room temperature, and the above polymer component is used for providing the properties of strength and high viscosity when it is substantially uncured. Based on volume percentage, the substantially amorphous thermoplastic resin usually comprises 10% to 75%, preferably 15% to 60%, and especially 25% to 45% of the polymer component. The substantially amorphous thermoplastic resin is selected from the group consisting essentially of polysulfone, polyethersulfone, polystyrene, polyphenylene oxide, polyphenylene sulfide, polyamide, phenoxy resin, polyimide, polyetherimide, polyetherimide/silicone block copolymer, polyurethane, polyester, polycarbonate, and acrylic resin (e.g., polymethyl methacrylate, styrene/Acrylonitrile, and styrene block copolymers).

Moreover, the thermoplastic plastic preferably includes a hydroxy-phenoxyether polymer structure. The hydroxy-phenoxyether is formed by a polymerization reaction of the stoichiometric mixture including diepoxide and difunctional species. The diepoxide is an epoxy resin with an epoxy equivalent of about 100 to 10000. For example, diglycidyl ether of bisphenol A, diglycidyl ether of 4,4'-sulfonylbisphenol, diglycidyl ether of 4,4'-oxybisphenol, diglycidyl ether of 4,4'-dihydroxybenzophenone, diglycidyl ether of hydroquinone, and diglycidyl ether of 9,9-(4-hydroxyphenyl)fluorine. The difunctional species is dihydric phenol, dicarboxylic acid, primary amine, dithiol, disulfonamide, or bissecondary amine. The dihydric phenol is selected from the group consisting essentially of 4,4'-isopropylidene bisphenol (bisphenol A), 4,4'-sulfonylbisphenol, 4,4'-oxybisphenol, 4,4'-dihydroxybenzophenone, and 9,9-bis(4-hydroxyphenyl) carbazole. The dicarboxylic acid is selected from the group consisting essentially of isophthalic acid, terephthalamic acid, 4,4'-biphenylenedicarboxylic acid, and 2,6-naphthalenedicarboxylic acid. The bis-secondary amine is selected from the group consisting essentially of piperazine, dimethyl piperazine, and 1,2-bis(N-aminomethyl)ethane. The primary amine is selected from the group consisting essentially of 4-methoxyaniline and 2-aminoethanol. The dithiol is 4,4'-dimercaptodiphenyl ether. The disulfonamide is selected from the group consisting essentially of N,N'-dimethyl-1,3-benzenedisulfonamide, and N,N'-bis(2-hydroxyethyl)-4,4-biphenyldisulfonamide. Moreover, the difunctional species also includes a mixture comprising two different functional groups for being reacted with the epoxide group, for example, salicylic acid and 4-hydroxybenzoic acid.

The thermoplastic plastic in the heat-conductive dielectric polymer material of the present invention is selected from the group consisting essentially of a reaction product of liquid epoxy resin with bisphenol A, bisphenol F, or bisphenol S, a reaction product of liquid epoxy resin with a divalent acid, and a reaction product of liquid epoxy resin with amines.

Besides the material listed in Table 1, the thermosetting epoxy resin in the heat-conductive dielectric polymer material of the present invention also can be selected from the thermosetting resin defined in "Saechtling International Plastic Handbook for the Technology, Engineer and User, 2nd (1987), pp. 1-2, Hanser Publishers, Munich." Calculated on a basis of volume percentage, the polymer component usually comprises 25% to 90%, preferably 40% to 85%, and especially preferably 55% to 75% of the thermosetting resin. The volume ratio of the substantially amorphous thermoplastic resin to the thermosetting resin in the polymer component ranges from about 1:9 to 3:1. The thermosetting resin preferably has a functionality of larger than 2. At room temperature, the thermosetting resin is liquid or solid. If cured without adding thermoplastic resin, the thermosetting resin is rigid or rubbery. The thermosetting resin is preferably uncured epoxy resin, and especially uncured epoxy resin defined by ASTM D 1763. The liquid epoxy resin can be further understood with reference to the description in "Engineered Materials Handbook, Engineering Plastics, Volume 2, and pp. 204-241. Publisher: ASM International Page 240-241." The term "epoxy resin" refers to a conventional dimeric epoxy resin, an oligomeric epoxy resin, or a polymeric resin. The epoxy resin is a reaction product of bisphenol A with epichlorohydrin, a reaction product (novolac resin) of phenol with formaldehyde, a reaction product of epichlorohydrin, cycloaliphatics, peracid epoxy resin with glyceryl ether, a reaction product of epichlorohydrin with p-amino phenol, a reaction product of epichlorohydrin with glyoxal tetraphenol, phenolic epoxy resin or bisphenol A epoxy resin. Commercially available epoxide is preferably 3,4-epoxycyclohexylmethyl 3,4-epoxycyclohexane formate (e.g., ERL 4221 of Union Carbide Company or CY-179 of Ciba Geigy Company) or bis(3,4-epoxycyclohexylmethyl) adipate (e.g., ERL 4299 of the Union Carbide Company). Commercially available diglycidyl ether of bisphenol A (DGEBA) is selected from Araldite 6010 of Ciba Geigy Company, DER 331 of Dow Chemical Company, and Epon 825, 828, 826, 830, 834, 836, 1001, 1004, or 1007 of Shell Chemical Company. Moreover, the polyepoxidized phenol formaldehyde novolac prepolymer is selected form DEN 431 or 438 of Dow Chemical Company and CY-281 of Ciba Geigy Company. The polyepoxidized cersol formaldehyde novolac prepolymer is selected from ENC 1285, 1280, or 1299 of Ciba Geigy Company. The poly polyol glycidyl ether is selected from Araldite RD-2 (based on butyl-1,4-diol) of the Ciba Geigy Company or Epon 812 (based on glycerol) of Shell Chemical Company. A suitable diepoxide of alkyl cycloalkylhydrocarbon is vinyl cyclohexane dioxide, e.g., ERL 4206 of Union Carbide Company. Moreover, a suitable diepoxide of cycloalkyl ether is bis(2,3-diepoxycyclopentyl)-ether, e.g., ERL 0400 of Union Carbide Company. Moreover, the commercially available flexible epoxy resin includes polyglycol diepoxy (e.g., DER 732 and 736 of the Dow Chemical Company), diglycidyl ether of linoleic dimmer acid (e.g., Epon 871 and 872 of Shell Chemical Company), and diglycidyl ether of bisphenol, wherein the aromatic ring is connected by a long aliphatic chain (e.g., Lekutherm X-80 of the Mobay Chemical Company).

Moreover, the thermosetting resin having multiple functional groups is selected from DEN 483 (novolac epoxy resin) of Dow Chemical Company, Epon 1031 (tetra-functional solid epoxy resin) of Shell Chemical Company and Araldite MY 720 (N,N,N',N'-tetraglycidyl-4,4'-methylene dianiline) of Ciba-Geigy Company. Moreover, the difunctional epoxy resin (dicyclic oxide) is selected from HPT 1071 (solid resin, N,N,N',N'-tetraglycidyl-a,a'-bis(4-aminophenyl) P-Di-Isopropylbenzene), HPT 1079 of Shell Chemical Company (solid diglycidyl ether of bisphenol-9-carbazole) or Araldite 0500/0510 (tridiglycidyl ether of p-aminophenol) of Ciba-Geigy Company.

The curing agent used in the present invention is selected from isophthaloyl dihydrazide, benzophenone tetracarboxylic dianhydride, diethyltoluene diamine, 3,5-dimethylthio-2,4-toluene diamine, dicyandiamide (obtained from Curazol 2PHZ of the American Cyanamid Company) or DDS (diaminodiphenyl sulfone, obtained from Calcure of Ciba-Geigy Company). The curing agent is selected from the substituted dicyandiamide (e.g., 2,6-xylylbiguanide), solid polyamide (e.g., HT-939 of Ciba-Geigy Company or Ancamine 2014AS of Pacific Anchor Company), solid aromatic amine (e.g., HPT 1061 and 1062 of Shell Chemical Company), solid anhydride hardener (e.g., pyromellitic dianhydride (PMDA)), phenolic resin hardener (e.g., poly(p-hydroxy styrene), imidazole, the adduct of 2-phenyl-2,4-dihydroxymethylimizole and 2,4-diamino-6[2'-methylimizole(1)]ethyl-s-triazinylisocyanate), boron trifluoride, and amine complex (e.g., Anchor 1222 and 1907 of Pacific Anchor Company), and trimethylol propane triacrylate.

As for the thermosetting epoxy resin, the curing agent is preferably dicyandiamide and is used together with an accelerating agent. The commonly used accelerating agent for curing includes urea or urea compounds, for example, 3-phenyl-1,1-dimethylurea, 3-(4-chlorophenyl)-1,1-dimethylurea, 3-(3,4-dichlorophenyl)-1,1-dimethylurea, 3-(3-chloro-4-methylphenyl)-1,1-dimethylurea and imidazole (e.g., 2-heptadecylimidazole, 1-cyanoethyl-2-phenylimidazole-trimellitate, or 2-[β-{2'-methylimidazol-(1')}]-ethyl-4,6-diamino-s-triazinyl).

If the thermosetting epoxy resin is urethane, then the curing agent can use blocked isocyanate, (e.g., alkyl phenol blocked isocyanate selected from Desmocap 11A of Mobay Corporation) or phenol blocked polyisocyanate adduct (e.g., Mondur S of Mobay Corporation). If the thermosetting epoxy resin is unsaturated polyester resin, then the curing agent can use peroxide or other free radical catalysts, such as dicumyl peroxide, 2,5-dimethyl-2,5-di(t-butylperoxy)hexane, t-butyl cumyl peroxide, and 2,5-dimethyl-2,5-di(t-butylperoxy)-3-hexyne. Moreover, the unsaturated polyester resin is crosslinked through radiation (e.g., an ultraviolet radiation, a high-power electron beam, or γ radiation).

Some thermosetting epoxy resin can be cured without using a curing agent. For example, if the thermosetting epoxy resin is a bismaleimide (BMI), the BMI are crosslinked under a high temperature, and a co-curing agent (e.g., O,O'-diallyl bisphenol A) may be added together to make the cured BMI tougher.

The above resin cross-linked by using a peroxide crosslinker, high-power electron beam, or γ radiation is preferably added with an unsaturated cross-linking agent, e.g., triallyl isocyanurate (TAIC), triallyl cyanurate (TAC) or TMPTA.

The above heat-conductive filler is selected from a nitride or an oxide. The nitride is selected from the group consisting essentially of zirconium nitride, boron nitride, aluminum nitride, and silicon nitride. The oxide is selected from the group consisting essentially of aluminum oxide, magnesium oxide, zinc oxide, and titanium dioxide.

The methods and features of this invention have been sufficiently described in the above examples and descriptions. It should be understood that any modifications or changes without departing from the spirit of the invention are intended to be covered in the protection scope of the invention.

What is claimed is:

1. A heat-conductive dielectric polymer material, comprising:
   a polymer component including a thermoplastic plastic and a thermosetting epoxy resin, wherein the thermoplastic plastic is present in an amount of 10% to 75% by volume of the polymer component;
   a curing agent for curing the thermosetting epoxy resin at a curing temperature; and
   a heat-conductive filler uniformly dispersed in the polymer component, wherein the heat-conductive filler is present in an amount of 70% by volume of the heat-conductive dielectric polymer material;
   wherein the heat-conductive dielectric polymer material is cured at temperature higher than 100 degree C to form a cured material having an inter-penetrating-network (IPN) structure and a heat conductivity larger than 0.5 W/mK; and wherein prior to curing, the thermoplastic plastic and the thermosetting epoxy resin are mutually soluble.

2. The heat-conductive dielectric polymer material of claim 1, wherein the thermoplastic plastic is an ultra-high molecular phenoxy resin.

3. The heat-conductive dielectric polymer material of claim 2, wherein the weight average molecular weight of the ultra-high molecular phenoxy resin is larger than 30000.

4. The heat-conductive dielectric polymer material of claim 1, wherein the thermosetting epoxy resin is an uncured liquid epoxy resin.

5. The heat-conductive dielectric polymer material of claim 1, wherein the thermosetting epoxy resin is a polymerized epoxy resin.

6. The heat-conductive dielectric polymer material of claim 1, wherein the thermosetting epoxy resin is a phenolic epoxy resin or a bisphenol A epoxy resin.

7. The heat-conductive dielectric polymer material of claim 1, wherein the thermoplastic plastic and the thermosetting epoxy resin are both homogeneous.

8. The heat-conductive dielectric polymer material of claim 1, wherein the thermoplastic plastic comprises a hydroxy-phenoxyether polymer structure.

9. The heat-conductive dielectric polymer material of claim 8, wherein the hydroxy-phenoxyether polymer structure is formed by polymerizing diepoxide with difunctional species selected from the group consisting of a dihydric phenol, a dicarboxylic acid, a primary amine, a dithiol, a disulfonamide, and a bis-secondary amine.

10. The heat-conductive dielectric polymer material of claim 9, wherein the thermoplastic plastic is formed by reacting a liquid epoxy resin with a dihydric phenol.

11. The heat-conductive dielectric polymer material of claim 9, wherein the thermoplastic plastic is formed by reacting a liquid epoxy resin with a dicarboxylic acid.

12. The heat-conductive dielectric polymer material of claim 9, wherein the thermoplastic plastic is formed by reacting a liquid epoxy resin with a primary amine or a bis-secondary amine.

13. The heat-conductive dielectric polymer material of claim 1, wherein the heat-conductive filler is a nitride or an oxide.

14. The heat-conductive dielectric polymer material of claim 13, wherein the nitride is selected from the group consisting of zirconium nitride, boron nitride, aluminum nitride, and silicon nitride.

15. The heat-conductive dielectric polymer material of claim 13, wherein the oxide is selected from the group consisting of aluminum oxide, magnesium oxide, zinc oxide, and titanium dioxide.

16. The heat-conductive dielectric polymer material of claim 1, wherein the heat-conductive filler, the thermosetting epoxy resin, and the thermoplastic plastic are present in a volume ratio of 70:23.5:5, respectively.

17. A heat dissipation substrate, comprising:
a first metal layer;
a second metal layer; and
a cured layer having an IPN structure and a heat conductivity larger than 0.5 W/mK wherein the cured layer is sandwiched between the first metal layer and the second metal layer so as to form a physical contact there between wherein the cured layer is formed by curing a heat-conductive dielectric polymer material at a temperature higher than 100 degree C, wherein said heat-conductive dielectric polymer material comprises:
a polymer component including a thermoplastic plastic and a thermosetting epoxy resin, the thermoplastic plastic present in an amount of 10% to 75% by volume of the polymer component, and the thermoplastic plastic and a thermosetting epoxy resin being mutually soluble,
a curing agent for curing the polymer component, and
a heat-conductive filler uniformly dispersed in the polymer component and present in an amount of 70% by volume of the heat-conductive dielectric polymer material;
wherein the heat dissipation substrate has a thickness of less than 0.5 mm, the heat dissipation substrate is capable of bearing a voltage of over 1000 volts.

18. The heat dissipation substrate of claim 17, wherein the interfaces between the heat-conductive dielectric polymer material layer and the first and second metal layers comprise at least one micro rough surface having a plurality of nodular protrusions with a diameter between 0.1 μm and 100 μm.

19. The heat dissipation substrate of claim 17, wherein the heat-conductive filler, the thermosetting epoxy resin, and the thermoplastic plastic are present in the heat-conductive dielectric polymer material in a volume ratio of 70:23.5:5, respectively.

* * * * *